(12) United States Patent
Kang et al.

(10) Patent No.: US 11,264,437 B2
(45) Date of Patent: Mar. 1, 2022

(54) DISPLAY DEVICES

(71) Applicant: SAMSUNG DISPLAY CO., LTD., Yongin-si (KR)

(72) Inventors: Suk Hoon Kang, Seoul (KR); Hoi-Lim Kim, Uijeongbu-si (KR); Min-Jae Kim, Suwon-si (KR); Beom-Soo Shin, Hwaseong-si (KR); Keun Chan Oh, Hwaseong-si (KR); Hong Yeon Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 312 days.

(21) Appl. No.: 16/410,115

(22) Filed: May 13, 2019

(65) Prior Publication Data

US 2019/0348484 A1   Nov. 14, 2019

(30) Foreign Application Priority Data

May 14, 2018 (KR) .................. 10-2018-0054709
Apr. 9, 2019 (KR) .................. 10-2019-0041435

(51) Int. Cl.
| *H01L 51/50* | (2006.01) |
| *H01L 27/32* | (2006.01) |
| *H01L 51/00* | (2006.01) |
| *C09K 11/06* | (2006.01) |

(52) U.S. Cl.
CPC ...... *H01L 27/3246* (2013.01); *H01L 51/0035* (2013.01); *H01L 51/502* (2013.01); *C09K 11/06* (2013.01); *H01L 51/0005* (2013.01); *H01L 51/0038* (2013.01)

(58) Field of Classification Search
None
See application file for complete search history.

(56) References Cited

U.S. PATENT DOCUMENTS

| 6,373,453 B1 | 4/2002 | Yudasaka |
| 6,380,672 B1 | 4/2002 | Yudasaka |
| 6,642,651 B2 | 11/2003 | Yudasaka |
| 6,755,983 B2 | 6/2004 | Yudasaka |

(Continued)

FOREIGN PATENT DOCUMENTS

| JP | 2000206509 | * 7/2000 | ........... H01L 21/312 |
| JP | 2007-324033 | 12/2007 | |

(Continued)

OTHER PUBLICATIONS

Extended European Search report corresponding to European Application No. 19174211.3, dated Sep. 19, 2019.

(Continued)

*Primary Examiner* — Gregory D Clark
(74) *Attorney, Agent, or Firm* — Kile Park Reed & Houtteman PLLC

(57) ABSTRACT

A display device includes a substrate, a thin film transistor provided on the substrate, a first electrode connected to the thin film transistor, a second electrode overlapping the first electrode, and a partition wall and a light-emitting device layer provided between the first electrode and the second electrode. The partition wall may include a main chain and a side chain connected to the main chain, and a carbon number of the side chain may be equal to or greater than 14.

20 Claims, 7 Drawing Sheets

(56) References Cited

U.S. PATENT DOCUMENTS

| | | |
|---|---|---|
| 6,806,504 B2 | 10/2004 | Park |
| 6,830,494 B1 | 12/2004 | Yamazaki et al. |
| 6,838,192 B2 | 1/2005 | Miyashita et al. |
| 7,015,503 B2 | 3/2006 | Seki et al. |
| 7,214,959 B2 | 5/2007 | Seki et al. |
| 7,273,801 B2 | 9/2007 | Seki et al. |
| 7,291,970 B2 | 11/2007 | Kuwabara |
| 7,307,381 B2 | 12/2007 | Ito et al. |
| 8,431,182 B2 | 4/2013 | Kimura et al. |
| 8,592,239 B2 | 11/2013 | Fennimore et al. |
| 8,753,801 B2 | 6/2014 | Saie et al. |
| 2017/0299965 A1 | 10/2017 | Hashimoto et al. |

FOREIGN PATENT DOCUMENTS

| | | |
|---|---|---|
| JP | 4061132 B2 | 3/2008 |
| JP | 5428657 B2 | 2/2014 |
| KR | 10-2013-0128157 A | 11/2013 |
| KR | 10-2014-0067645 A | 6/2014 |
| KR | 10-2016-0129995 A | 11/2016 |
| WO | 2011/081151 | 7/2011 |

OTHER PUBLICATIONS https://www.ncbi.nlm.nih.gov/pccompound?cmd=Link&LinkName=pccompound_pccompound&from_uid=53748830, Similar Compounds for PubChem Compound (Select 53748830)—PubChem Compound—NCBI.

\* cited by examiner

DISPLAY DEVICES

CROSS-REFERENCE TO RELATED APPLICATION

Korean Patent Application No. 10-2018-0054709 filed on May 14, 2018, and Korean Patent Application No. 10-2019-0041435 filed on Apr. 9, 2019, in the Korean Intellectual Property Office, and entitled: "Display Device," are incorporated by reference herein in their entirety.

BACKGROUND

1. Field

Embodiments relate to a display device.

2. Description of the Related Art

An inkjet printing device may be used to discharge fine droplets of an ink to a desired position on a printed medium and printing a predetermined image. An application range of the inkjet printing device may include, for example, various fields including a flat panel display field such as a liquid crystal display (LCD) and an organic light emitting device (OLED), a flexible display field such as an E-paper, a printed electronics field such as metal wires, and an organic thin film transistor (OTFT).

The above information disclosed in this Background section is only for enhancement of understanding of the background of the invention and therefore it may contain information that does not form the prior art that is already known in this country to a person of ordinary skill in the art.

SUMMARY

Embodiments are directed to a display device, including a substrate, a thin film transistor provided on the substrate, a first electrode connected to the thin film transistor, a second electrode overlapping the first electrode, and a partition wall and a light-emitting device layer provided between the first electrode and the second electrode. The partition wall may include a main chain and a side chain connected to the main chain, and a carbon number of the side chain may be equal to or greater than 14.

The main chain may be a polyimide-based polymer.

The main chain may be a reaction product of a dianhydride compound and a diamine compound.

The main chain may be a reaction product of at least one compound from among Formulae 1-1 to 1-6 and at least one compound from among Formulae 2-1 to 2-6:

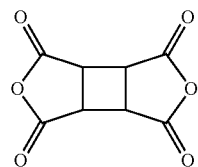

[Formula 1-1]

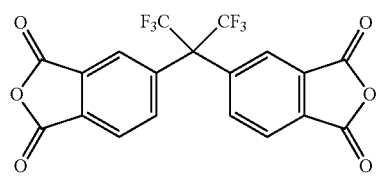

[Formula 1-2]

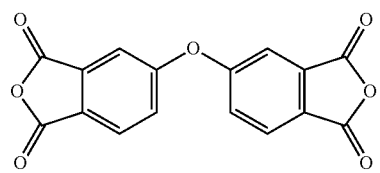

[Formula 1-3]

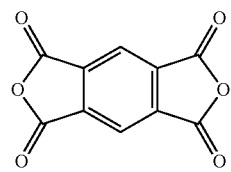

[Formula 1-4]

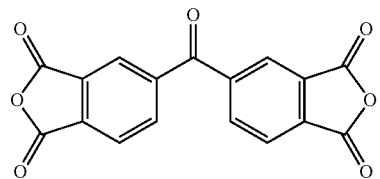

[Formula 1-5]

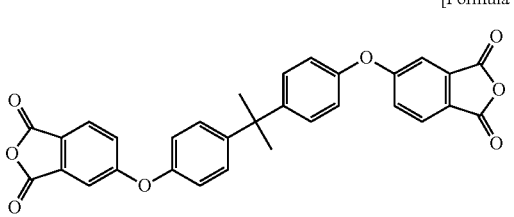

[Formula 1-6]

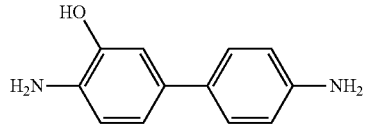

[Formula 2-1]

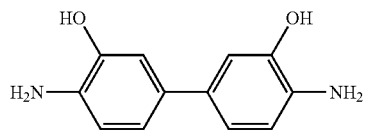

[Formula 2-2]

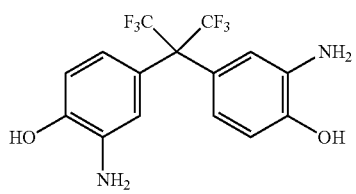

[Formula 2-3]

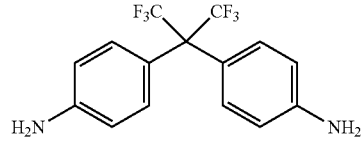

[Formula 2-4]

[Formula 2-5]

[Formula 2-6]

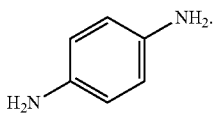

The side chain may include fluorine.

The partition wall may further include an addition product of an additive including fluorine, and the additive may include at least one reactive group from among an acryl group, a methacryl group, an epoxy group, or a maleimide group that may react with the main chain.

The additive may be connected in a side chain form to the main chain.

The additive may be one or more of Formulae 3-1 to 3-6:

[Formula 3-1]

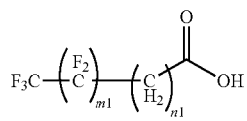

[Formula 3-2]

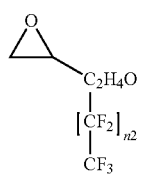

[Formula 3-3]

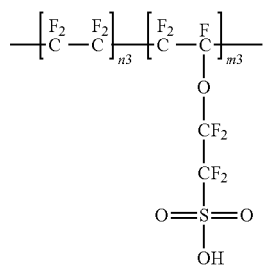

[Formula 3-4]

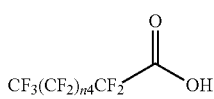

[Formula 3-5]

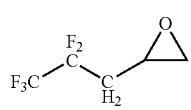

[Formula 3-6]

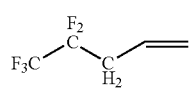

wherein m1 and n1 may independently be an integer that is equal to or less than 30, n2 is an integer of 1 to 30, m3 and n3 may independently be an integer that is equal to or less than 30, and n4 may be an integer of 1 to 30.

The side chain may be provided by a compound represented by Formula 4:

[Formula 4]

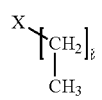

wherein the X may be one of

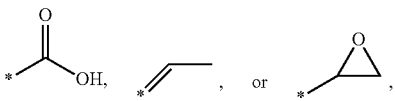

and l may be equal to or greater than 13.

The partition wall may further include a reaction product of one or more of an initiator, a crosslinking agent, a photoactive compound, or a surfactant.

Embodiments are also directed to a display device, including a substrate, a thin film transistor provided on the substrate, a first electrode connected to the thin film transistor, a second electrode overlapping the first electrode, and a partition wall and a light-emitting device layer provided between the first electrode and the second electrode. The partition wall may include a main chain and a side chain connected to the main chain, the side chain may include fluorine, and a carbon number of the side chain may be equal to or greater than 8.

The side chain may include a number of fluorine atoms that is equal to or greater than 8.

The side chain may be provided by one or more of Formulae 5-1 to 5-5:

[Formula 5-1]

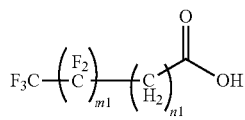

[Formula 5-2]

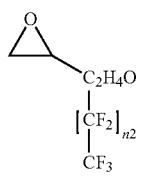

[Formula 5-3]

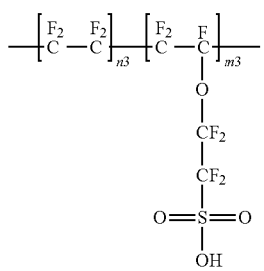

[Formula 5-4]

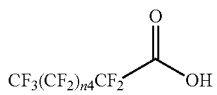

[Formula 5-5]

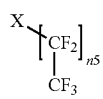

wherein, m1 and n1 may independently be an integer that is equal to or less than 30, n2 may be an integer of 5 to 30, m3 and n3 may independently be an integer that is equal to or less than 30, provided that a sum of the m3 and n3 is equal to or greater than 2, n4 may be an integer of 6 to 30, n5 may be equal to or greater than 7, and X may be one of

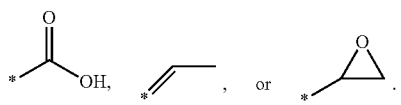

The main chain may be a polyimide-based polymer.

The main chain may be a reaction product of a dianhydride compound and a diamine compound.

The main chain may be a reaction product of at least one compound from among Formulae 1-1 to 1-6 and at least one compound from among Formulae 2-1 to 2-6:

[Formula 1-1]

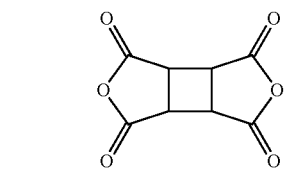

[Formula 1-2]

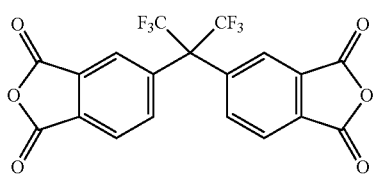

[Formula 1-3]

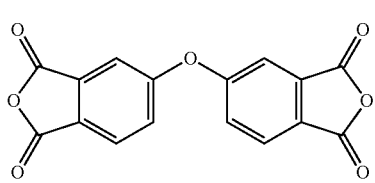

[Formula 1-4]

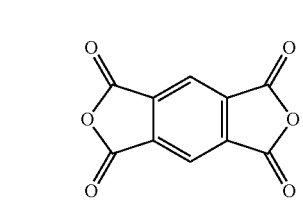

[Formula 1-5]

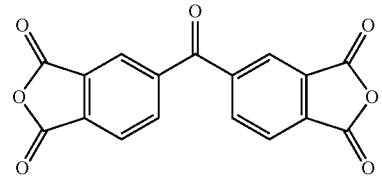

[Formula 1-6]

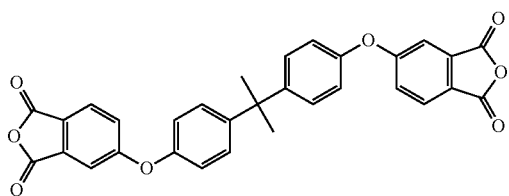

[Formula 2-1]

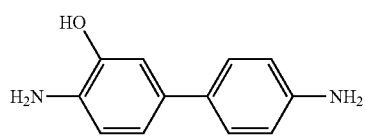

[Formula 2-2]

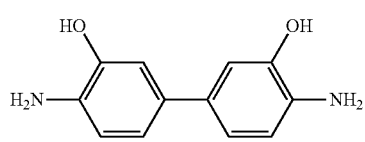

[Formula 2-3]

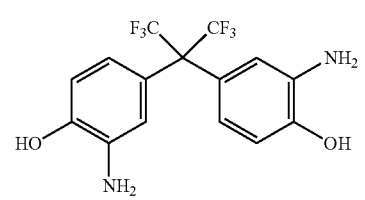

[Formula 2-4]

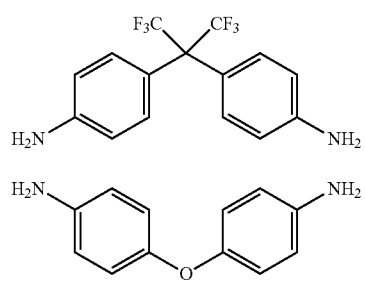

[Formula 2-5]

[Formula 2-6]

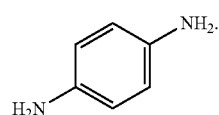

The partition wall may further include an addition product of an additive including fluorine, and the additive may include at least one reactive group from among an acryl group, a methacryl group, an epoxy group, or a maleimide group that may react with the main chain.

The additive may be connected in a side chain form to the main chain.

The additive may be one of Formulae 3-1 to 3-6:

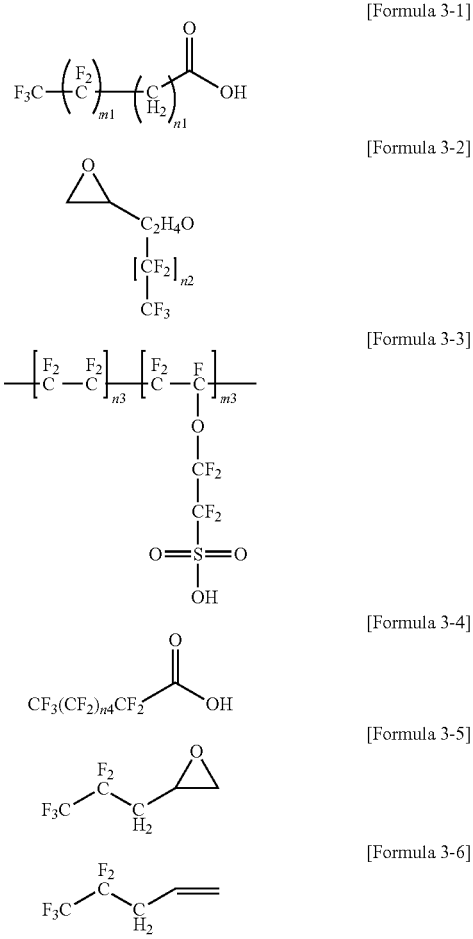

wherein:

m1 and n1 may independently be an integer that is equal to or less than 30, n2 may be an integer of 1 to 30, m3 and n3 may independently be an integer that is equal to or less than 30, and n4 may be an integer of 1 to 30.

The partition wall may further include a reaction product of one or more of an initiator, a crosslinking agent, a photoactive compound, or a surfactant.

The light-emitting device layer may further include an emission layer, and the emission layer may include a quantum dot material.

BRIEF DESCRIPTION OF THE DRAWINGS

Features will become apparent to those of skill in the art by describing in detail example embodiments with reference to the attached drawings in which.

DETAILED DESCRIPTION

Figure 1:
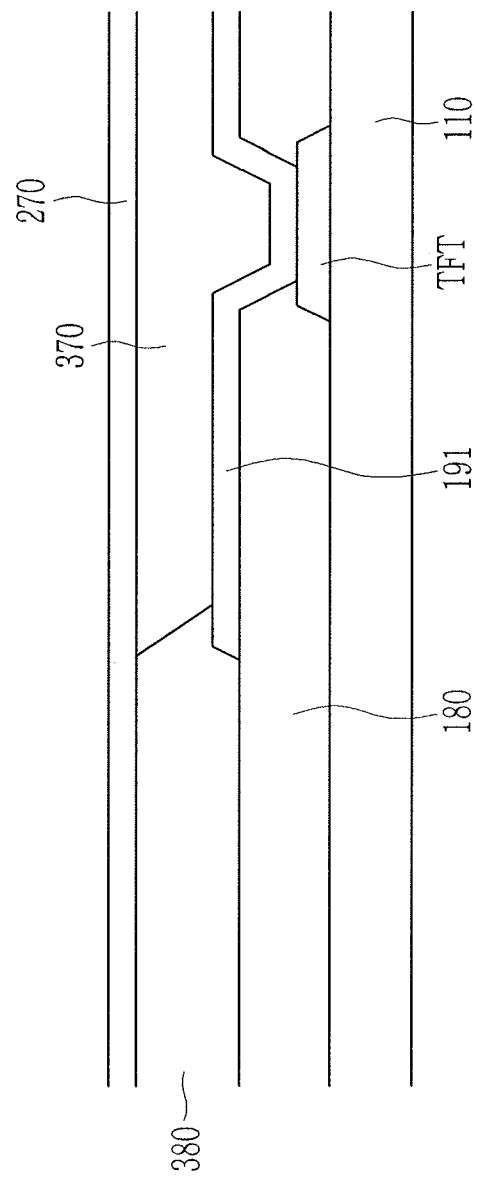
FIG. 1 illustrates a display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

FIG. 1 illustrates a display device according to an example embodiment.

Referring to FIG. 1, according to the present example embodiment, the emissive display device includes a substrate 110, a thin film transistor (TFT) provided on the substrate 110, a first electrode 191 connected to the thin film transistor (TFT), a second electrode 270 overlapping the first electrode 191, a partition wall 380 provided between the first electrode 191 and the second electrode 270, and a light-emitting device layer 370.

According to the present example embodiment, the partition wall 380 includes a main chain and a side chain connected to the main chain. A carbon number of the side chain, i.e., a number of carbons of the side chain, may be equal to or greater than 14. The side chain with a carbon number that is equal to or greater than 14 may help the partition wall 380 to be hydrophobic. The contact angle of the partition wall 380 may be equal to or greater than 80 degrees.

Figure 2:
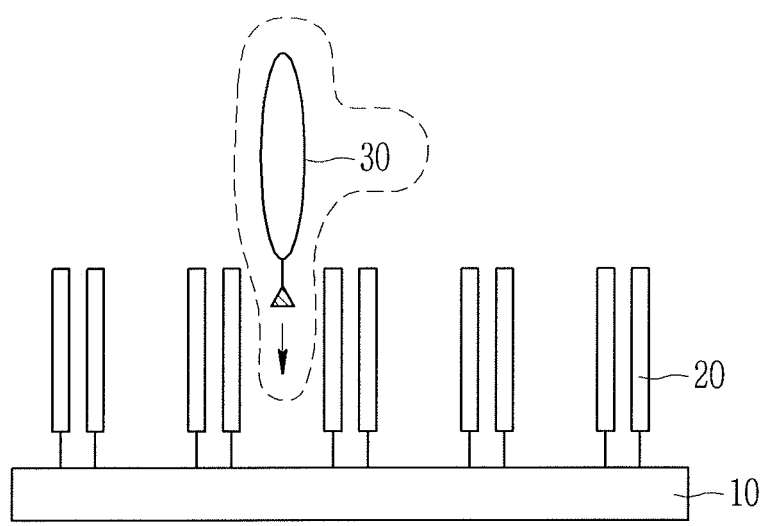
FIG. 2 illustrates a configuration of a partition wall according to an example embodiment.

FIG. 2 illustrates a configuration of a partition wall 380 according to an example embodiment.

Referring to FIG. 2, according to the present example embodiment, the partition wall 380 includes a main chain 10 and a side chain 20 connected to the main chain 10, and an additive 30 is connected in a side chain form to the main chain 10.

According to the present example embodiment, the side chain 20 has a carbon number that is equal to or greater than 14, it is arranged in a direction extending from, e.g., perpendicular to, the main chain 10. The side chain 20 may enhance hydrophobic properties of the partition wall 380.

In an example embodiment, the additive 30 may include fluorine. The hydrophobic property of the partition wall 380 may be further improved by the fluorine included in the additive 30. In another implementation, the partition wall 380 may not include the additive 30. In this case, the partition wall 380 may be provided with a hydrophobic property by the side chain 20 with a carbon number that is equal to or greater than 14.

The main chain of the partition wall 380 may be, for example, a polyimide-based polymer. For example, the main chain 10 may be a reaction product of a dianhydride compound and a diamine compound.

For example, the main chain 10 may be a reaction product of at least one compound from among Formulae 1-1 to 1-6 and at least one compound from among Formulae 2-1 to 2-6.

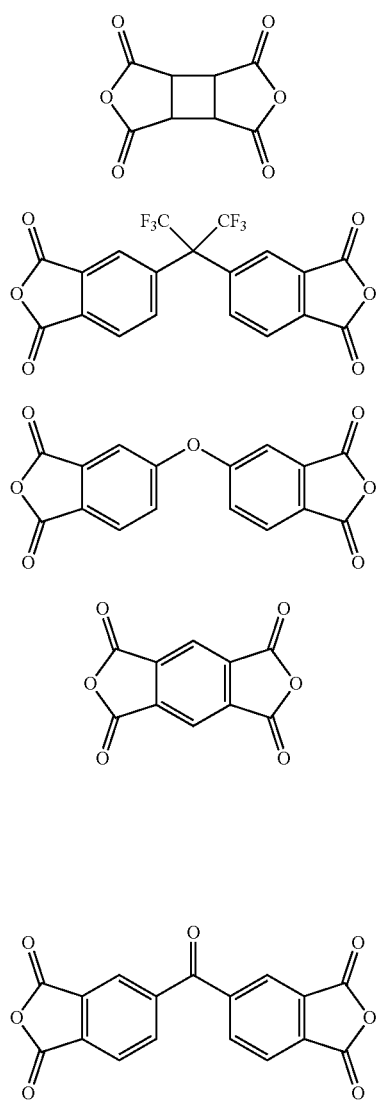

[Formula 1-1]

[Formula 1-2]

[Formula 1-3]

[Formula 1-4]

[Formula 1-5]

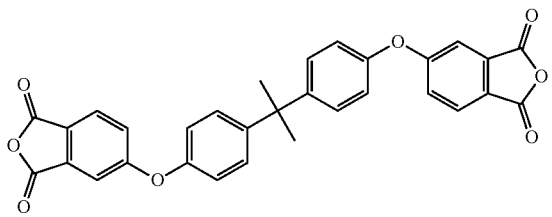

[Formula 1-6]

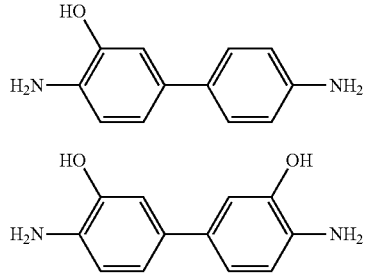

[Formula 2-1]

[Formula 2-2]

[Formula 2-3]

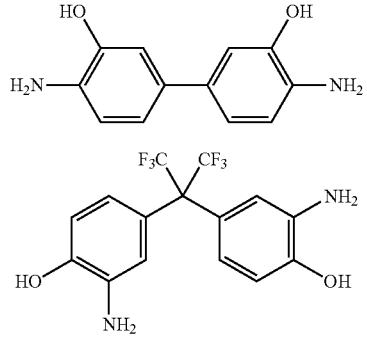

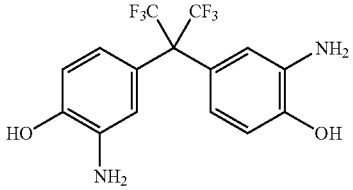

[Formula 2-4]

[Formula 2-5]

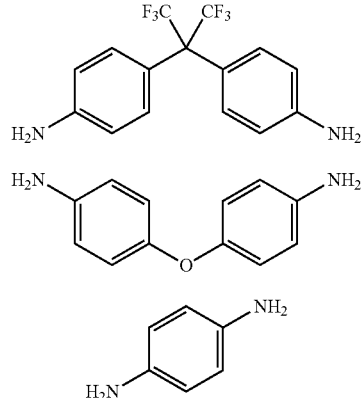

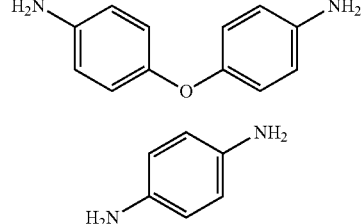

[Formula 2-6]

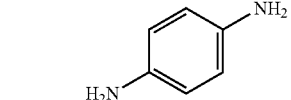

In an example embodiment, the main chain 10 may be a reaction product of:

a first compound that is one of pyromellitic acid dianhydride, 3,3',4,4'-biphenyl tetracarboxylic acid dianhydride, 2,3,3',4'-biphenyl tetracarboxylic acid dianhydride, 3,3',4,4'-benzophenone tetracarboxylic acid dianhydride, 3,3',4,4'-diphenyl ether tetracarboxylic acid dianhydride, 3,3'4,4'-diphenyl methane tetracarboxylic acid dianhydride, 2,2-bis(3,4-dicarboxylic phenyl)propane dianhydride, 2,2-bis(3,4-dicarboxylic phenyl)hexafluoropropane dianhydride, 3,3',4,4'-diphenyl sulfone tetracarboxylic acid dianhydride, 2,2-bis[4-(3,4-dicarboxylic phenoxy)phenyl]propane dianhydride, 4,4'-bis(3,4-dicarboxylic phenoxy)diphenyl ether dianhydride, 4,4'-bis(3,4-dicarboxylic phenoxy)diphenyl sulfide dianhydride, 4,4'-bis(3,4-dicarboxylic phenoxy)benzophenone dianhydride, 4,4'-bis(3,4-dicarboxylic phenoxy)diphenyl sulfone dianhydride, 2,2-bis[4-(2,3-dicarboxylic phenoxy)phenyl]propane dianhydride, 4,4'-bis(2,3-dicarboxylic phenoxy)diphenyl ether dianhydride, 4,4'-bis(2,3-dicarboxylic phenoxy)diphenyl sulfide dianhydride, 4,4'-bis(2,3-dicarboxylic phenoxy)benzophenone dianhydride, 4,4'-bis(2,3-dicarboxylic phenoxy)diphenyl sulfone dianhydride, 4-(2,3-dicarboxylic phenoxy)-4'-(3,4-dicarboxylic phenoxy)diphenyl-2,2-propane dianhydride, 4-(2,3-dicarboxylic phenoxy)-4'-(3,4-dicarboxylic phenoxy)diphenyl ether dianhydride, 4-(2,3-dicarboxylic phenoxy)-4'-(3,4-dicarboxylic phenoxy)diphenyl sulfide dianhydride, 4-(2,3-dicarboxylic phenoxy)-4'-(3,4-dicarboxylic phenoxy)benzophenone dianhydride, or 4-(2,3-dicarboxylic phenoxy)-4'-(3,4-dicarboxylic phenoxy)diphenyl sulfone dianhydride, and a second compound that is one of cyclic-based diamines including ethylene diamine, propylene diamine, trimethylene diamine, hexamethylene diamine, heptamethylene diamine, octamethylene diamine, nonamethylene diamine, decamethylene diamine, 1,12-dodecane diamine, 1,18-octadecane diamine, 3-methylheptamethylene diamine, 4,4-dimethylheptamethylene diamine, 4-methylnonamethylene diamine, 5-methylnonamethylene diamine, 2,5-dimethylhexamethylene diamine, 2,5-dimethylheptamethylene diamine, 2,2-dimethylpropylene diamine, N-methyl-bis(3-aminopropyl)amine, 3-methoxyhexamethylene diamine, 1,2-bis(3-aminopropoxy)ethane, bis(3-aminopropyl)sulfide, 1,4-cyclohexane diamine, bis-(4-aminocyclohexyl)methane, or 1,3-diamino adamantane.

In an example embodiment, the main chain 10 may have a structure of Formula A:

[Formula A]

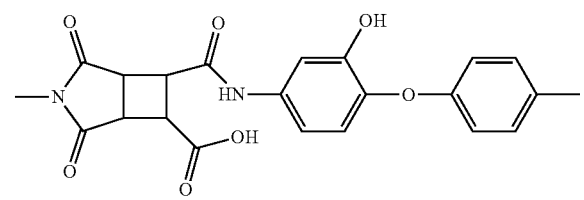

In an example embodiment, the side chain 20 may be provided by a compound represented by Formula 4:

[Formula 4]

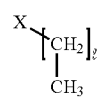

In Formula 4, X may be one of

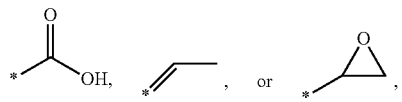

and the l may be equal to or greater than 13. The * shows a position where X is combined to Formula 4.

In an example embodiment, the main chain 10 may have a structure of Formula C:

[Formula C]

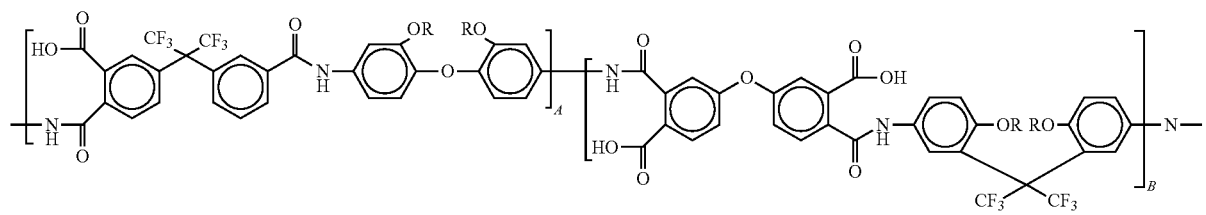

In Formula C, a sum of A and B is greater than 0 and may be, for example, 1 to 10,000.

The OR may be, for example, one of

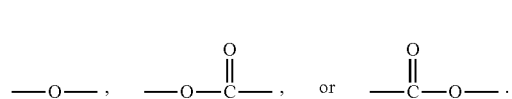

in which the A may be a C1 to C30 alkyl or a C6 to C30 aromatic.

In another implementation, the OR may be, for example, $K\text{--}(CH_2)_m\text{--}(CF_{3-x}H_x)_n$, in which a sum of m and n may be equal to or greater than 8, x may be 0 to 3, and K may be one of $$—O—, \quad —O—\overset{\overset{O}{\|}}{C}—, \quad \text{or} \quad —\overset{\overset{O}{\|}}{C}—O—.$$

In addition to the above-noted structure, the A and B of the OR may include various structures of diamine and dianhydride. Further, part of the above-noted structure may be replaced with an amine.

The additive 30 may include fluorine.

The additive 30 may include at least one reactive group of an acryl group, a methacryl group, an epoxy group, or a maleimide group that may react with the main chain 10. The additive 30 may be connected in a side chain form to the main chain 10 through the reactive group.

The additive 30 may be, for example, one of Formulae 3-1 to 3-6.

[Formula 3-1]
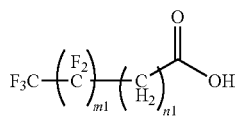

[Formula 3-2]
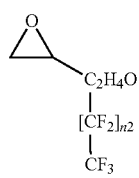

[Formula 3-3]
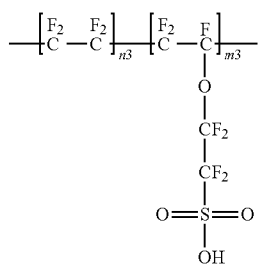

[Formula 3-4]
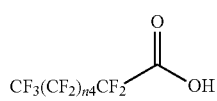

[Formula 3-5]
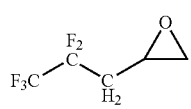

[Formula 3-6]
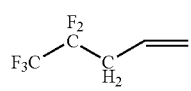

In Formulae 3-1 to 3-6, m1 and n1 may independently be an integer that is equal to or less than 30, n2 may be an integer of 1 to 30, m3 and n3 may independently be an integer that is equal to or less than 30, and n4 may be an integer of 1 to 30.

The partition wall 380 may further include a reaction product of one or more of an initiator, a crosslinking agent, a photoactive compound, or a surfactant. When the partition wall 380 is a positive photoresist, it may include a photoactive compound, and when the partition wall 380 is a negative photoresist, it may include an initiator.

When the partition wall 380 includes a main chain 10 and a side chain 20 with a carbon number that is equal to or greater than 14 connected to the main chain 10, the partition wall may have a hydrophobic property while the partition wall 380 does not include fluorine. In this instance, the contact angle of the partition wall 380 may be equal to or greater than 80 degrees. Thus, when distilled water is dripped on the partition wall 380, the contact angle of water drops of the distilled water with respect to the partition wall 380 may be equal to or greater than 80 degrees. Therefore, when the light-emitting device layer 370 is formed by the inkjet process, a material of the hydrophilic light-emitting device layer 370 may be prevented from overflowing outside the partition wall 380. Therefore, the light-emitting device layer 370 may be efficiently formed by the inkjet process.

Figure 3:
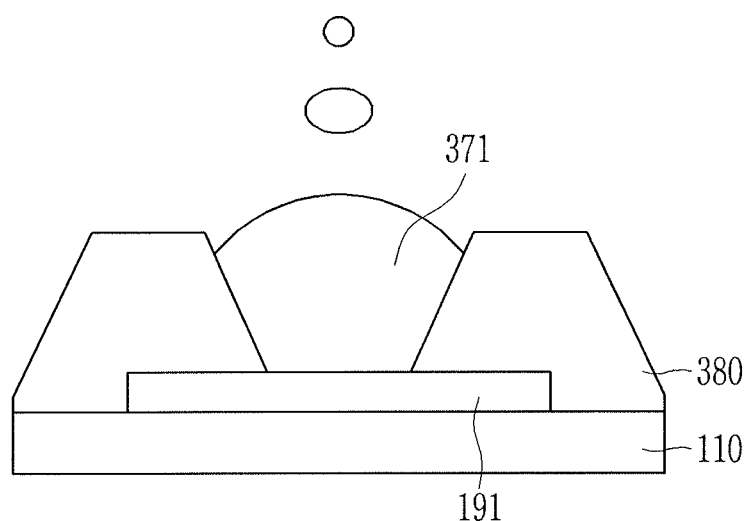
FIG. 3 illustrates a spreading property of an inkjet material in a display device including a hydrophobic partition wall according to an example embodiment.
Figure 4:
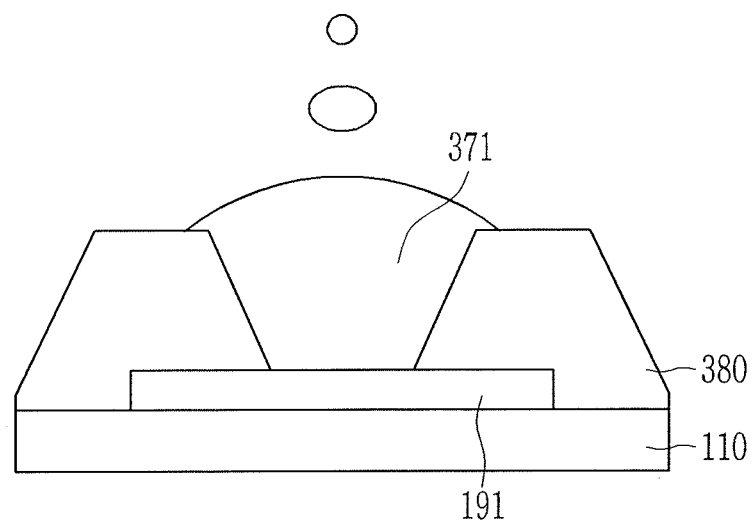
FIG. 4 illustrates a spreading property of an inkjet material in a display device including a partition wall according to a comparative example of the present invention.

FIG. 3 shows a spreading property of an inkjet material in a display device including a hydrophobic partition wall 380 according to an example embodiment, and FIG. 4 shows a spreading property of an inkjet material in a display device including a partition wall 380 according to a comparative example.

Referring to FIG. 3, in the display device with a hydrophobic partition wall 380 according to an example embodiment, the inkjet material 371 does not overflow the partition wall 380. However, in the display device with a partition wall 380 that is not sufficiently hydrophobic according to a comparative example, the inkjet material 371 overflows the partition wall 380.

In FIG. 3, a surface tension of the partition wall 380 may be equal to or less than 30 dyne/cm. In FIG. 4 showing a comparative example, the surface tension of the partition wall 380 may be equal to or greater than 40 dyne/cm. The comparative example may not have a sufficient hydrophobic property.

According to the present example embodiment, when the partition wall 380 includes no fluorine, it may be hydrophobic because of the main chain 10 and the side chain 20 that is connected to the main chain 10 and it has a carbon number that is equal to or greater than 14.

Tables 1 to 3 below show contact angles measured by changing carbon numbers of the side chain 20 and a number of $CF_2$ or $CF_3$ included in the side chain. A structure of a formula included as a main chain in Table 1, Table 2, and Table 3 is represented by Formula 7.

[Formula 7]
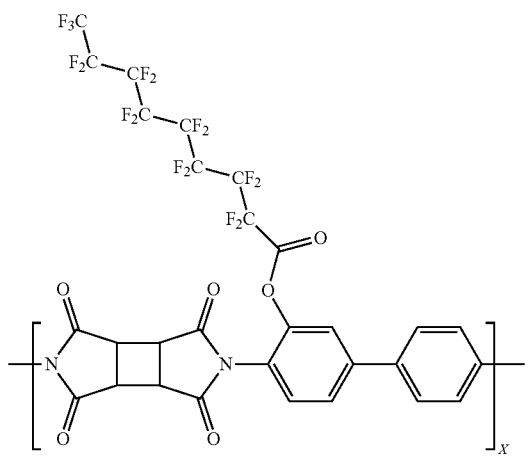
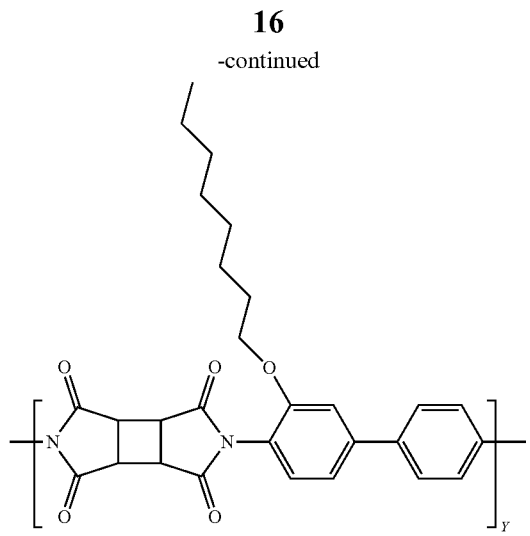
TABLE 1
Contact angles (degrees) w/H$_2$O
| Carbon Number | Numbers of CF$_2$ (CF$_3$) | | | | | | | |
|---|---|---|---|---|---|---|---|---|
| | Nos. 0 | Nos. 3 | Nos. 4 | Nos. 5 | Nos. 7 | Nos. 9 | Nos. 11 | Nos. 13 | Nos. 15 |
| 8 | 74 | 80 | 86 | 86 | 90 | | | | |
| 10 | 76 | 76 | 80 | 84 | 94 | 104 | | — | |
| 12 | 78 | 82 | 86 | 94 | 100 | 102 | 108 | | |
| 14 | 82 | 86 | 94 | 100 | 104 | 108 | 110 | 114 | |
| 16 | 92 | 92 | 98 | 100 | 110 | 110 | 112 | 116 | 116 |
TABLE 2
Contact angles (degrees) w/H$_2$O
| Carbon Number | Numbers of CF$_2$ (CF$_3$) | | | | | | | |
|---|---|---|---|---|---|---|---|---|
| | Nos. 0 | Nos. 3 | Nos. 4 | Nos. 5 | Nos. 7 | Nos. 9 | Nos. 11 | Nos. 13 | Nos. 15 |
| 8 | 76 | 80 | 84 | 88 | 90 | | | | |
| 10 | 76 | 76 | 80 | 92 | 94 | 104 | | | |
| 12 | 78 | 82 | 90 | 100 | 102 | 102 | 108 | | |
| 14 | 82 | 94 | 94 | 104 | 104 | 108 | 112 | 114 | |
| 16 | 92 | 92 | 98 | 108 | 112 | 114 | 116 | 116 | 116 |
TABLE 3
Contact angles (degrees) w/H$_2$O
| Carbon Number | Numbers of CF$_2$ (CF$_3$) | | | | | | | |
|---|---|---|---|---|---|---|---|---|
| | Nos. 0 | Nos. 3 | Nos. 4 | Nos. 5 | Nos. 7 | Nos. 9 | Nos. 11 | Nos. 13 | Nos. 15 |
| 8 | 74 | 78 | 84 | 90 | 92 | | | | |
| 10 | 70 | 76 | 80 | 94 | 96 | 106 | | | |
| 12 | 76 | 82 | 86 | 94 | 100 | 102 | 110 | | |
| 14 | 78 | 86 | 94 | 104 | 104 | 108 | 112 | 116 | |
| 16 | 82 | 90 | 98 | 108 | 112 | 114 | 116 | 116 | 116 |

Referring to Table 1 to Table 3, it is determined that, when $CF_2$ or $CF_3$ is 0 and the carbon number is equal to or greater than 14, the contact angle is equal to or greater than 80 degrees.

According to example embodiments, the main chain may include a compound represented by Formula 8 or Formula 9:

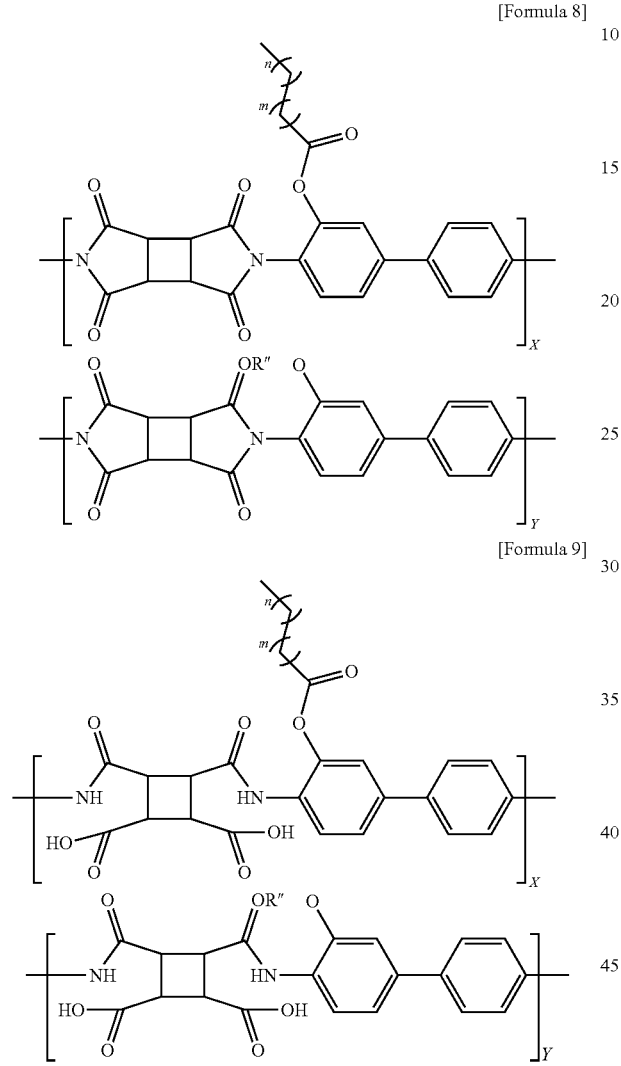

[Formula 8]

[Formula 9]

In Formula 7. Formula 8 and Formula 9, X and Y may be 1 to 10,000, and a sum of m and n may be equal to or greater than 8. Further, the R' may be one of —H, alkyl, aromatic, OCO alkyl, or OCO halogen.

A display device according to another example embodiment will now be described.

A display device according to the present example embodiment may correspond to the above-described example embodiments except that the side chain 20 of the partition wall 380 according to the present example embodiment includes fluorine. Repeated description of details that are the same as the above-described constituent elements may be omitted for clarity.

According to the present example embodiment, the side chain 20 includes fluorine, and the carbon number of the side chain may be equal to or greater than 8. The side chain 20 includes fluorine, and thus when the carbon number of the side chain is less than the above-described example embodiment, the partition wall may still exhibit a contact angle that is equal to or greater than 80 degrees. For example, the side chain may include at least eight fluorine atoms.

In the present example embodiment, the side chain 20 may be formed by a reaction of one or more of Formulae 5-1 to 5-5:

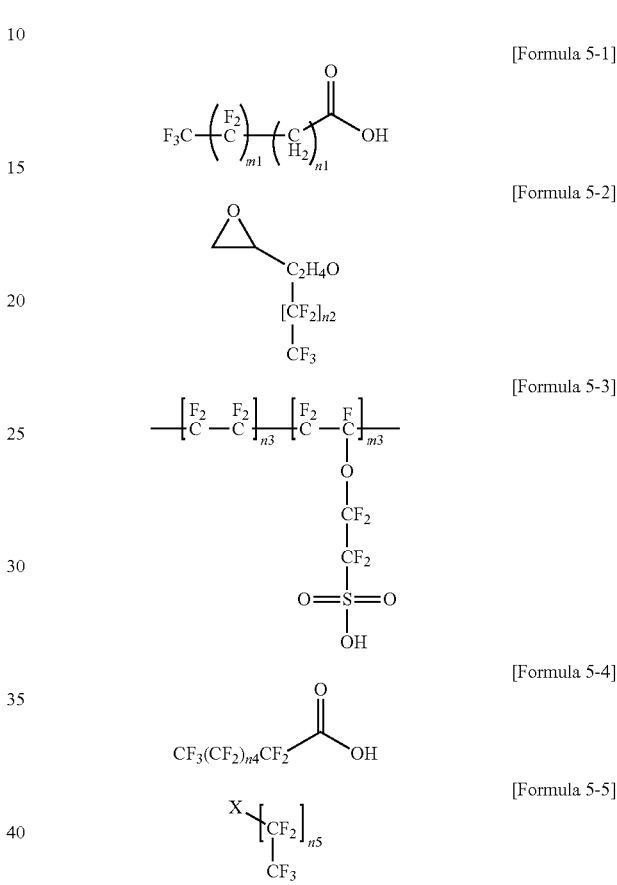

[Formula 5-1]

[Formula 5-2]

[Formula 5-3]

[Formula 5-4]

[Formula 5-5]

In Formulae 5-1 to 5-5, m1 and n1 may independently be an integer that is equal to or less than 30, n2 may be an integer of 5 to 30, m3 and n3 may independently be an integer that is equal to or less than 30, a sum of m3 and n3 may be equal to or greater than 2, n4 may be an integer of 6 to 30, X may be one of

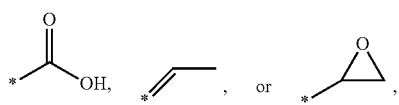

and n5 may be equal to or greater than 7.

Description of the main chain 10 corresponds to the above-described example embodiments. The main chain 10 may be a polyimide-based polymer. For example, the main chain 10 may be a reaction product of a dianhydride compound and a diamine compound.

For example, the main chain 10 may be a reaction product of at least one compound from among Formulae 1-1 to 1-6 and at least one compound from among Formulae 2-1 to 2-6.

[Formula 1-1] 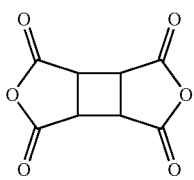
[Formula 2-1] 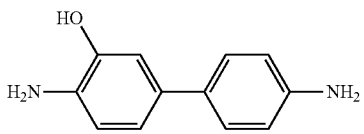
[Formula 1-2] 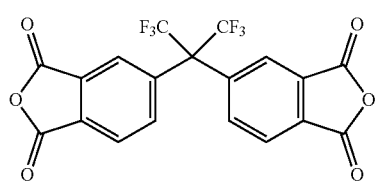
[Formula 2-2] 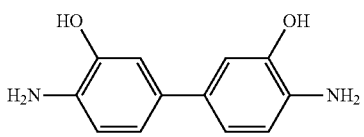
[Formula 1-3] 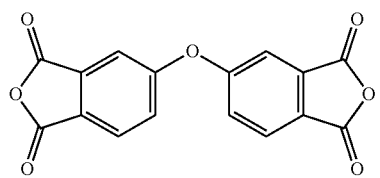
[Formula 2-3] 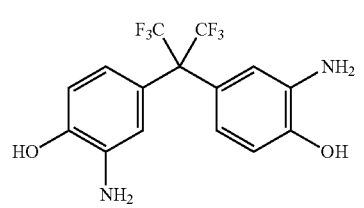
[Formula 1-4] 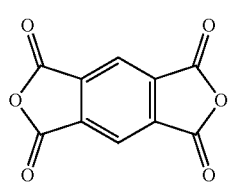
[Formula 2-4] 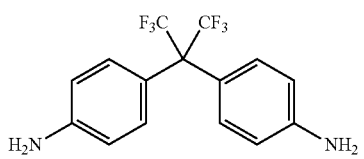
[Formula 1-5] 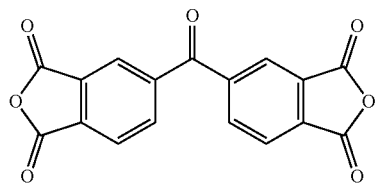
[Formula 2-5] 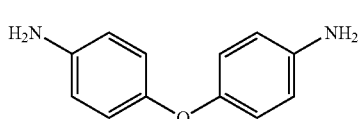
[Formula 1-6] 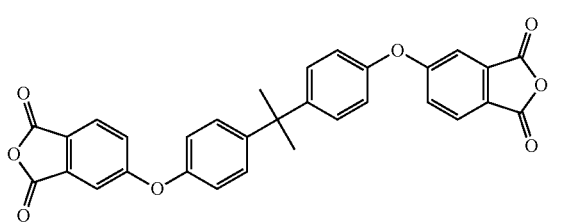
[Formula 2-6] 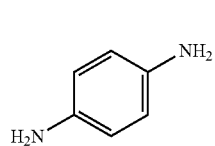

In an example embodiment, the partition wall may have a structure represented by, for example, Formula B:

[Formula B]

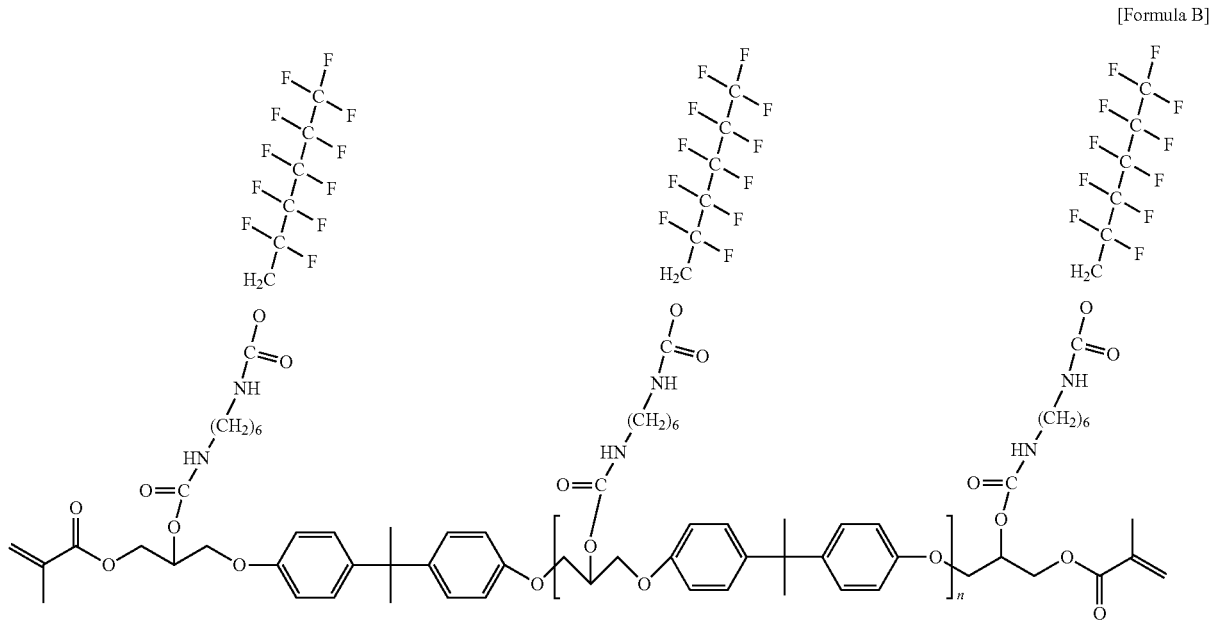

Referring to Formula B, the partition wall includes a side chain connected to the main chain, and the side chain includes fluorine. A partition wall formed using Formula B may have an enhanced hydrophobic property because of the side chain including fluorine.

The partition wall may include an addition product of an additive 30. The additive 30 may include fluorine. The additive 30 may include at least one reactive group from among an acryl group, a methacryl group, an epoxy group, or a maleimide group that may react with the main chain 10. The additive 30 may be connected in a side chain form to the main chain 10 through the reactive group.

The additive 30 may be, for example, one or more of Formulae 3-1 to 3-6:

[Formula 3-1]
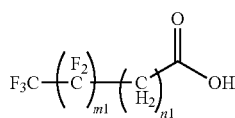

[Formula 3-2]
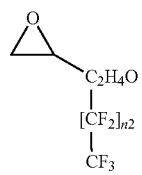

-continued

[Formula 3-3]
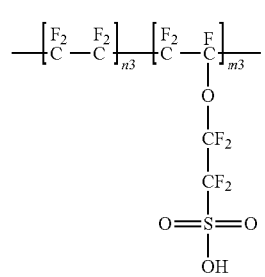

[Formula 3-4]
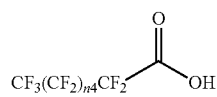

[Formula 3-5]
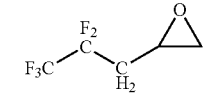

[Formula 3-6]
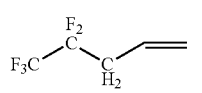

In Formulae 3-1 to 3-6, m1 and n1 may independently be an integer that is equal to or less than 30, n2 may be an integer of 1 to 30, m3 and n3 may independently be an integer that is equal to or less than 30, and n4 may be an integer of 1 to 30.

Some of the compounds of Formulae 3-1 to 3-6, which are examples of the additive 30, have a similar structure to the side chain. Thus, in the present example embodiment in which the side chain 20 includes fluorine, the additive 30 may be substantially similar to the side chain 20. The partition wall 380 may further include one or more of an initiator, a crosslinking agent, a photoactive compound, or a surfactant.

Referring to Table 1 to Table 3, when CF2 or CF3 is equal to or greater than 4, it is determined that the contact angle is equal to or greater than 80 degrees when the carbon number is equal to or greater than 8. Thus, the above-described example embodiment shows the hydrophobic property exhibiting the contact angle that is equal to or greater than 80 degrees when the fluorine number is 0 and the carbon number is equal to or greater than 14, and the partition wall composition according to the present example embodiment includes fluorine, so it has the hydrophobic property that has the contact angle that is equal to or greater than 80 degrees when the carbon number is equal to or greater than 8.

A process for manufacturing a partition wall composition according to an example embodiment will now be described.

In the synthesis method described below, a side chain 20 or an additive 30 is connected to a main chain 10.

A reaction for connecting the side chain 20 to the main chain 10 may be given as Reaction Formula 1:

[Reaction Formula]

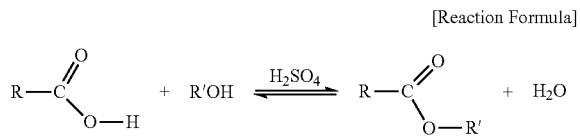

In Reaction Formula 1, R'OH is a main chain, and RCOOH is a side chain or an additive.

When a thick sulfuric acid exists as a catalyst, RCOOH and R'OH generate an esterification reaction. In this instance, a mole ratio of RCOOH and R'OH may be 2:1, for example. The reaction may be reversible and slow, and it may be performed slowly for about two hours or more at room temperature. When the reacted solution is precipitated in methanol, a product that has undergone an esterification reaction is precipitated. When the precipitated polymer is dried, a side chain connected to a main chain may be generated. In this instance, it is possible to control a reaction rate of the side chain by controlling a content of the side chain material (RCOOH). For example, 3 mM of R'OH may be included, and 6 mM of RCOOH may be included.

In an example embodiment, the R'OH (the main chain) may be a compound represented by Formula A, and the RCOOH (the side chain) may be a compound represented by Formula C, for example.

[Formula A]

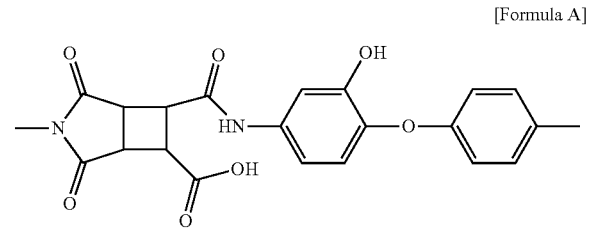

[Formula C]

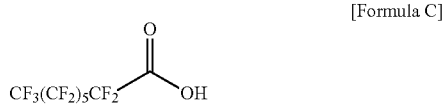

A display device including a partition wall according to an example embodiment will now be described in detail with reference to drawings.

Figure 5:
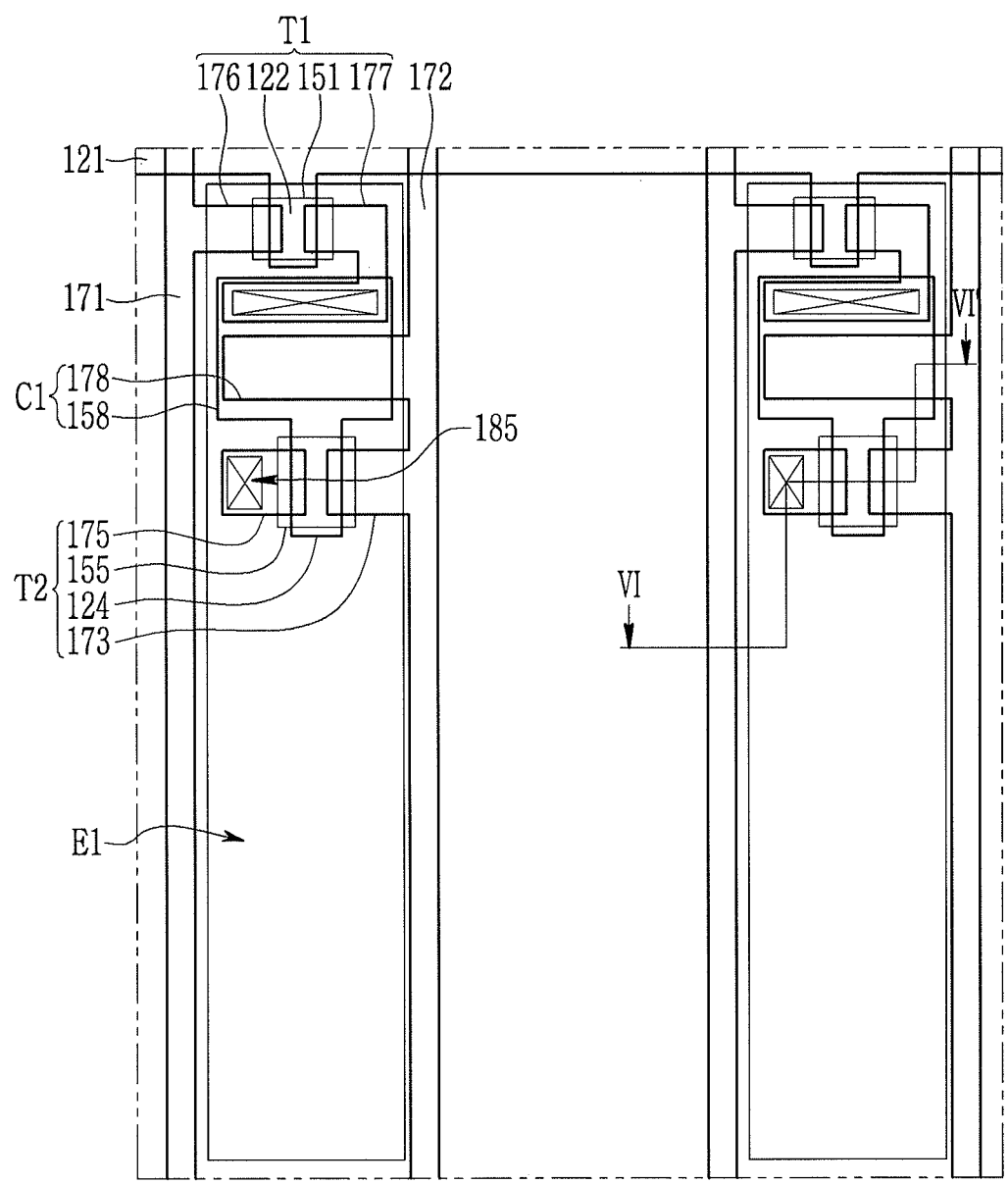
FIG. 5 illustrates a top plan view of a display device according to an example embodiment.
Figure 6:
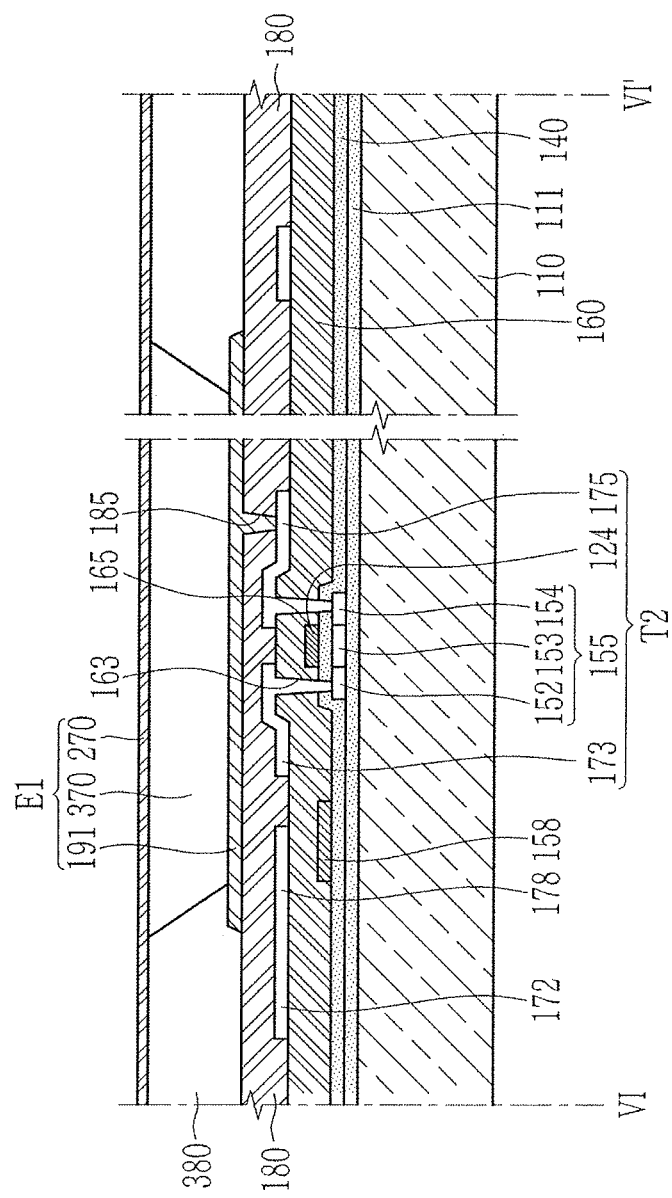
FIG. 6 illustrates a cross-sectional view with respect to a line VI-VI' of FIG. 5.

FIG. 5 shows a top plan view of a display device according to an example embodiment. FIG. 6 shows a cross-sectional view with respect to a line VI-VI' of FIG. 5.

The drawings show a 2Tr-1Cap-structured active-matrix (AM) emissive display device including two thin film transistors (TFTs) T1 and T2 and a capacitor C1 at each pixel of a display area, but this is merely an example.

In an example embodiment, in the emissive display device, one pixel may include at least three transistors and at least two capacitors, and additional wires may be further included to have various configurations. Here, the pixel represents a minimum unit for displaying an image, and a display area displays an image through a plurality of pixels.

Referring to FIG. 5 and FIG. 6, the emissive display device according to the present example embodiment includes a switching thin film transistor T1, a driving thin film transistor T2, a capacitor C1, and a light-emitting device E1 respectively formed on a plurality of pixels provided on a substrate 110. A gate line 121 disposed in one direction, and a data line 171 and a common power line 172 crossing the gate line 121 in an insulating manner, are provided on the substrate 110. Here, the pixel may be defined by the gate line 121, the data line 171, and the common power line 172 as borders, for example.

The light emitting element E1 includes a first electrode 191, a light-emitting device layer 370 formed on the first electrode 191, and a second electrode 270 formed on the light-emitting device layer 370.

Here, the first electrode 191 is an anode that is a hole injection electrode, and the second electrode 270 is a cathode that is an electron injection electrode. However, the first electrode 191 may be a cathode and the second electrode 270 may be an anode depending on the method for driving an emissive display device. The first electrode 191 may be a pixel electrode, and the second electrode 270 may be a common electrode.

The light-emitting device layer 370 may include one or more of a hole injection layer, a hole transfer layer, an emission layer, an electron transfer layer, or an electron injection layer. The emission layer may include an organic emission layer, and light emits when excitons that are generated when the injected holes and electrons are combined enter a ground state from an excited state. In another implementation, the emission layer may include a quantum dot. In case of the emission layer include an organic emission layer, the emission layer may include blue, red, or green light emitting materials, and may further include a host and a dopant. The materials included in the emission layer are not limited. For example, the emission layer may include blue emitting materials such as oxadiazole dimer dyes (e.g., bis-DAPDXP), Spiro compounds (e.g., spiro-DPVBi, spiro-6P), triarylamine compounds, bis(styryl)amine compounds (e.g., DPVBi, DSA), 4,4'-bis(9-ethyl-3-carbazovinylene)-1,1'-biphenyl (BCzVBi), perylene, 2,5,8,11-tetra-tert-butyl perylene (TPBe), 9H-carbazol-3,3'-(1,4-phenylene-di-2,1-ethene-diyl)bis[9-ethyl-9C] (BCzVB), 4,4-bis[4-(di-p-tolylamino)styryl]biphenyl (DPAVBi), 4-(di-p-tolylamino)-4'-[(di-p-tolylamino)styryl] stilbene (DPAVB), 4,4'-bis[4-(diphenylamino)styryl]biphenyl (BDAVBi), bis(3,5-difluoro-2-(2-pyridyl)phenyl-(2-carboxypyridyl)iridium(III) (FIrPic), and/or the like; green emitting materials such as 3-(2-benzothiazolyl)-7-(diethylamino)coumarin (Coumarin 6), 2,3,6,7-tetrahydro-1,1,7,7,-tetramethyl-1H,5H,11H-10-(2-benzothiazolyl)quinolizino-[9,9a,1gh]coumarin (C545T), N,N'-dimethyl-quinacridone (DMQA), tris(2-phenylpyridine)iridium(III) (Ir(ppy)$_3$), and/or the like; and red emitting materials such as tetraphenylnaphthacene (Rubrene), tris(1-phenylisoquinoline)iridium(III) (Ir(piq)$_3$), bis(2-benzo[b]thiophen-2-yl-pyridine), (acetylacetonate) iridium(III) (Ir(btp)$_2$(acac)), tris(dibenzoylmethane) phenanthroline europium(III) (Eu(dbm)$_3$(phen)), a tris[4,4'-di-tert-butyl-(2,2)-bipyridine]ruthenium(III) complex (Ru (dtb-bpy)$_3$*2 PF$_6$), DCM1, DCM2, Eu(thenoyl-trifluoroacetone)$_3$ (Eu(TTA)$_3$, butyl-6-(1,1,7,7-tetramethyl-julolidyl-9-enyl)-4H-pyran: (DCJTB), and/or the like. Furthermore, a light emitting polymer material may be included. For example, a polymer such as phenylene, poly (p-phenylene vinylene), thiophene, fluorene, spiro-fluorene, and/or the like, or an aromatic compound including nitrogen and/or the like may be included, but embodiments are not limited thereto.

The emission layer may be manufactured by additionally doping a light emitting dopant into an emission layer host. Non-limiting examples of fluorescent light emitting host materials may include tris(8-hydroxy-quinolinato)aluminum (Alq3), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-methylphenyl (p-DM-DPVBi), ter(9,9-diarylfluorene)s (TDAFs), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAFs), 4,4'-bis(2,2-diphenyl-ethene-1-yl)-4,4'-di-(tert-butyl)phenyl (p-TDPVBi), and/or the like, and non-limiting examples of phosphorescent host materials may include 1,3-bis(carbazole-9-yl)benzene (mCP), 1,3,5-tris(carbazole-9-yl)benzene (tCP), 4,4',4"-tris(carbazole-9-yl)triphenylamine (TcTa), 4,4'-bis(carbazole-9-yl)biphenyl (CBP), 4,4'-bis(9-carbazolyl)-2,2'-dimethyl-biphenyl (CBDP), 4,4'-bis(carbazole-9-yl)-9,9-dimethyl-fluorene (DM-FL-CBP), 4,4'-bis(carbazole-9-yl)-9,9-bis(9-phenyl-9H-carbazole)fluorene (FL-4CBP), 4,4'-bis(carbazole-9-yl)-9,9-ditolyl-fluorene (DPFL-CBP), 9,9-bis(9-phenyl-9H-carbazole)fluorene (FL-2CBP), and/or the like.

The content of the light emitting dopant may vary according to the material forming the emission layer, but generally, the content of the light emitting dopant may be in a range of about 3 to about 10 parts by weight based on 100 parts by weight of the material forming the emission layer (total weight of the host and the dopant). In case of the emission layer include a quantum dot, a core of the quantum dot may be selected from among a group II-VI compound, a group III-V compound, a group IV-VI compound, a group IV element, a group IV compound, and a combination thereof.

The group II-VI compound may be selected from among a binary compound selected from among CdSe, CdTe, ZnS, ZnSe, ZnTe, ZnO, HgS, HgSe, HgTe. MgSe, MgS, and a mixture thereof; a tertiary compound selected from among AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from among HgZnTeS, CdZnSeS, CdZnS erre, CdZnSTe, CdHgSeS, CdHgSeTe, CdHgSTe, HgZnSeS, HgZnSeTe, HgZnSTe, and a mixture thereof.

The group III-V compound may be selected from among a binary compound selected from among GaN, GaP, GaAs, GaSb, AlN, AlP, AlAs, AlSb, InN, InP, InAs, InSb, and a mixture thereof; a tertiary compound selected from among GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a quaternary compound selected from among GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compound may be selected from among a binary compound selected from among SnS, SnSe, SnTe, PbS, PbSe, PbTe, and a mixture thereof; a tertiary compound selected from among SnSeS, SnSeTe, SnSTe, PbSeS, PbSeTe, PbSTe, SnPbS, SnPbSe, SnPbTe, and a mixture thereof; and a quaternary compound selected from among SnPbSSe, SnPbSeTe, SnPbSTe, and a mixture thereof. The group IV element may be selected from among SI, Ge, and a mixture thereof. The group IV compound may be a binary compound selected from among SiC, SiGe, and a mixture thereof.

In this instance, the binary compound, the tertiary compound, or the quaternary compound may exist in particles at a uniform concentration, or may exist in the same particle divided into states where concentration distributions partially differ. Further, the color conversion media layer may have a core/shell structure where one quantum dot surrounds another quantum dot. An interface between the core and the shell may have a concentration gradient such that a concentration of an element existing in the shell is gradually reduced nearing the center thereof.

In several exemplary embodiments, the quantum dot may have a core-shell configuration including a core including the nanocrystal and a shell surrounding the core. The shell of the quantum dot may function as a passivation layer for maintaining a semiconductor characteristic by preventing a chemical change of the core and/or function as a charging layer for assigning an electrophoretic characteristic to the quantum dot. The shell may be a single layer or a multilayer. An interface of the core and the shell may have a gradient of concentration in which the concentration of the element existing in the shell reduces as it approaches the center. An example of the shell of the quantum dot includes an oxide of a metal or a non-metal, a semiconductor compound, or a combination thereof.

For example, the oxide of a metal or a non-metal may exemplify a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO or a tertiary compound such as $MgAl_2O_4$, $CoFe_2O_4$, $NiFe_2O_4$, and $CoMn_2O_4$, and the present exemplary embodiment is not limited thereto.

The semiconductor compound may exemplify CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the present exemplary embodiment is not limited thereto.

The quantum dot may have a full width at half maximum (FWHM) of an emission wavelength spectrum of about 45 nm or less, preferably about 40 nm or less, and more preferably about 30 nm or less, and in this range, color purity or color reproducibility may be improved.

Also, the light emitted through the quantum dot is irradiated in all directions, thereby improving a light viewing angle.

Further, the form of the quantum dot is one generally used in the art and is not particularly limited, but more specifically, it may be formed to be spherical, pyramidal, multi-armed, or cubic nanoparticles, nanotubes, nanowires, nanofibers, and nanoplate-shaped particles.

The quantum dot may control the colors of light emitted according to a size of particles, and the quantum dot may accordingly have various emitting colors such as red, green, and blue.

The capacitor C1 includes a pair of capacitive plates 158 and 178 disposed with an interlayer insulating layer 160 therebetween. Here, the interlayer insulating layer 160 is a dielectric material. Capacitance is determined by charges stored in the capacitor C1 and a voltage between a pair of capacitive plates 158 and 178.

The switching thin film transistor T1 includes a switching semiconductor layer 151, a switching gate electrode 122, a switching source electrode 176, and a switching drain electrode 177. The driving thin film transistor T2 includes a driving semiconductor layer 155, a driving gate electrode 124, a driving source electrode 173, and a driving drain electrode 175.

The switching thin film transistor T1 is used as a switching element for selecting a pixel to emit. The switching gate electrode 122 is connected to the gate line 121, and the switching source electrode 176 is connected to the data line 171. The switching drain electrode 177 is separately disposed from the switching source electrode 176 and is connected to one capacitive plate 158.

The driving thin film transistor T2 applies driving power for emitting the light-emitting device layer 370 of the light emitting element E1 in the selected pixel to the first electrode 191. The driving gate electrode 124 is connected to the capacitive plate 158 connected to the switching drain electrode 177. The driving source electrode 173 and the other capacitive plate 178 are respectively connected to the common power line 172.

The driving drain electrode 175 is connected to the first electrode 191 through a contact hole 185.

A light emitting device according to an example embodiment will now be described in detail with reference to FIG. 5 and FIG. 6.

In the present example embodiment, a buffer layer 111 is provided on the substrate 110. The substrate 110 may be made of glass, quartz, ceramic, or plastic. The buffer layer 111 may be made of a silicon nitride ($SiN_y$), a silicon oxide ($SiO_2$), a silicon oxynitride ($SiO_xN_y$), etc. The x and y may respectively be 1 to 5, for example.

In the present example embodiment, a driving semiconductor layer 155 is formed on the buffer layer 111. The driving semiconductor layer 155 may be made of various semiconductor materials such as a polysilicon film or an amorphous silicon film. The driving semiconductor layer 155 may include a source region 152, a channel region 153, and a drain region 154.

In the present example embodiment, a gate insulating layer 140 made of a silicon nitride or a silicon oxide is provided on the driving semiconductor layer 155. A driving gate electrode 124 and a first capacitive plate 158 are provided on the gate insulating layer 140. In this instance, the driving gate electrode 124 overlaps at least a portion of the driving semiconductor layer 155, in detail, the channel region 153.

In the present example embodiment, an interlayer insulating layer 160 covering the driving gate electrode 124 is provided on the gate insulating layer 140. The interlayer insulating layer 160 may be formed of a silicon nitride or a silicon oxide in a like manner of the gate insulating layer 140. The gate insulating layer 140 and the interlayer insulating layer 160 have a first contact hole 163 and a second contact hole 165 for exposing a source region 152 and a drain region 154 of the driving semiconductor layer 155.

In the present example embodiment, a driving source electrode 173, a driving drain electrode 175, a data line 171, a common power line 172, and a second capacitive plate 178 are provided on the interlayer insulating layer 160. The driving source electrode 173 and the driving drain electrode 175 are connected to the source region 152 and the drain region 154 of the driving semiconductor layer 155 through the first contact hole 163 and the second contact hole 165.

In the present example embodiment, an insulating layer 180 for covering the driving source electrode 173 and the driving drain electrode 175 is provided on the interlayer insulating layer 160. The insulating layer 180 may include an organic material such as a polyacryl or a polyimide.

In the present example embodiment, the insulating layer 180 includes a contact hole 185. The first electrode 191 is provided on the insulating layer 180. The first electrode 191 may be a pixel electrode. The first electrode 191 is connected to the driving drain electrode 175 through the contact hole 185.

In the present example embodiment, the partition wall 380 is provided on the insulating layer 180. The description on the partition wall 380 corresponds to the above-provided descriptions of example embodiments. Thus, the partition wall 380 may include a main chain and a side chain connected to the main chain, the carbon number of the side chain may be 14, and the contact angle of the partition wall may be equal to or greater than 80 degrees. In another implementation, the partition wall 380 may include a main chain and a side chain connected to the main chain, the side chain may include fluorine, the carbon number of the side chain may be equal to or greater than 8, and the contact angle of the partition wall may be equal to or greater than 80 degrees. In this instance, the number of the fluorine atoms of the side chain may be equal to or greater than 8. Further, the partition wall may further include an addition product of an additive including fluorine. The additive may include at least one reactive group from among the acryl group, the methacryl group, the epoxy group, or the maleimide group that may react with the main chain, and the additive may be connected in a side chain form to the main chain through the reactive group. The partition wall may further include one or more of the initiator, the crosslinking agent, the photoactive compound, or the surfactant. Detailed descriptions of the main chain, the side chain, and the additive of the partition wall 380 correspond to the above-provided descriptions.

In the present example embodiment, the light-emitting device layer 370 is provided to overlap the first electrode 191, and the second electrode 270 is provided to overlap the light-emitting device layer 370. The light-emitting device layer 370 may include one or more of the hole injection layer, the hole transfer layer, the emission layer, the electron transfer layer, or the electron injection layer. The second electrode 270 may be a common electrode. The light-emitting device E1 includes a first electrode 191, a light-emitting device layer 370, and a second electrode 270.

The partition wall 380 of the display device according to the present example embodiment includes a main chain 10 and a side chain 20 connected thereto. When the carbon number of the side chain is equal to or greater than 14, the side chain may not contain fluorine and the partition wall 380 may be hydrophobic without fluorine in the side chain, and the partition wall 380 may have the contact angle that is equal to or greater than 80 degrees. Further, when the side chain includes fluorine, the partition wall 380 may have the contact angle that is equal to or greater than 80 degrees when the carbon number is equal to or greater than 8.

The partition wall 380 with an excellent hydrophobic property by the side chain may prevent the inkjet material 371 from overflowing the partition wall 380 when the light-emitting device layer 370 is formed by the inkjet, and may efficiently form the light-emitting device layer 370.

Figure 7:
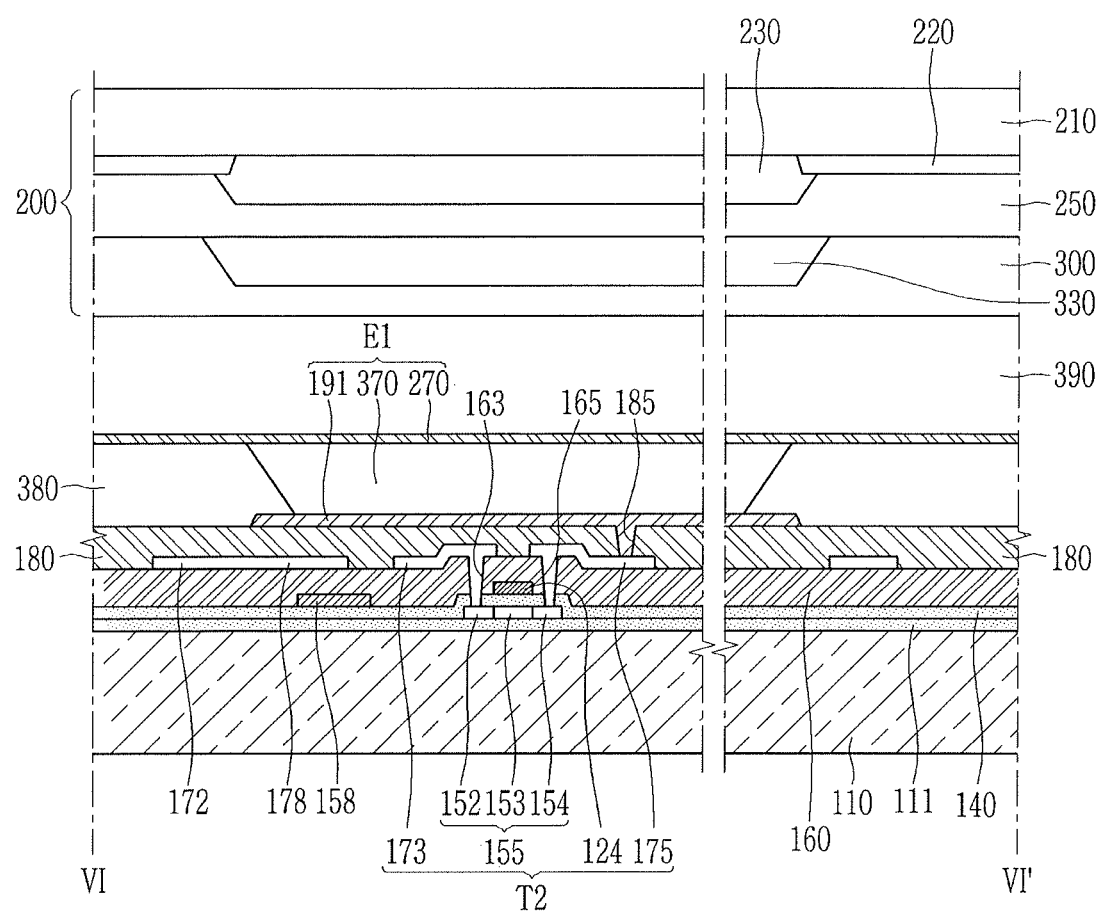
FIG. 7 shows a same cross-section as that of FIG. 6 in a display device according to another exemplary embodiment of the present invention.

FIG. 7 shows a display device according to another exemplary embodiment of the present invention. Referring to FIG. 7, the display device corresponds to the display device described with reference to FIG. 6 except for the configuration of a color converting panel 200. No description on the same configurational elements will be provided, The emission layer of the light-emitting device layer 370 may emit blue light. The blue light passes through the color converting layer 330 of the color converting panel 200 to be converted to red or green light or transmitted as blue through the converting layer.

Regarding the color converting panel 200, A color filter 230 is provided on a second substrate 210. Here, the color filter 230 is provided between the first substrate 110 and the second substrate 210. A light blocking member 220 is provided between the color filter 230 and the second substrate 210, and the light blocking member 220 may partly overlap the color filter 230.

A color filter insulating layer 250 is provided on the color filter 230 and the light blocking member 220. A color converting layer 330 is provided on the color filter insulating layer 250. That is, the color filter insulating layer 250 is provided between the color converting layer 330 and the color filter 230. The color converting layer 330 may be provided to overlap the color filter 230.

The color converting layer 330 includes a quantum dot and converts incident light into another color of light. A description on the quantum dot corresponds to the above-provided description. The color converting layer 330 may include a green color converting layer, a red color converting layer, and a blue color converting layer, and it may convert the blue light emitted by the light-emitting device layer 370 into green light or red light or transmit the blue light.

An encapsulation layer 390 may be provided between the color converting panel 200 and the second electrode 270.

That is, regarding the display device according to an exemplary embodiment of FIG. 7, the display panel including a light-emitting device layer 370 and the color converting panel 200 including a color converting layer 330 are combined. The light-emitting device layer 370 may emit blue light. The blue light passes through the color converting layer 330 and is converted into red light or green light by the respective color converting layers or is transmitted as blue light by the transmission layer.

The light having transmitted through the color converting layer 330 passes through the respective color filters, and color purity is improved. In addition, the color filter 230 is prevented to not generate a color conversion on the color converting layer 330 by light input from the outside.

By way of summation and review, when droplets are discharged through the inkjet printing device to form a film, a shape attached to a substrate in an earlier stage may be changed according to surface energy between the ink and the substrate to be printed. In the case of an emission layer, if an emission layer is not correctly formed on a bank wall, an electrical short circuit may be generated, and/or a thickness of the emission layer may not be uniform so that brightness may not be uniform and a lifespan may be reduced. Further, when discharged droplets flow not inside but outside the bank, a short circuit may be generated or efficiency may be deteriorated.

As described above, embodiments relate to a display device with a partition wall including a main chain and a side chain and having a hydrophobic property. Embodiments may provide a display device including a hydrophobic partition wall that includes a main chain and a side chain connected thereto, and having a contact angle that is equal to or greater than 80 degrees. The present invention has been made in an effort to provide a display device for efficiently forming a light-emitting device layer by an inkjet process when a partition wall is hydrophobic. According to the example embodiments, the display device has a hydrophobic partition wall, thereby efficiently forming the light-emitting device layer according to the inkjet process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A display device, comprising:
a substrate;
a thin film transistor provided on the substrate;
a first electrode connected to the thin film transistor;
a second electrode overlapping the first electrode; and
a partition wall and a light-emitting device layer provided between the first electrode and the second electrode,
wherein:
the partition wall includes:
a main chain that is a polyimide-based polymer; and
a side chain connected to the main chain, and
the side chain is a moiety having a carbon number equal to or greater than 14.

2. The display device as claimed in claim 1, wherein the main chain is a reaction product of a dianhydride compound and a diamine compound.

3. The display device as claimed in claim 1, wherein the main chain is a reaction product of at least one compound from among Formulae 1-1 to 1-6 and at least one compound from among Formulae 2-1 to 2-6:

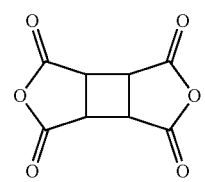

[Formula 1-1]

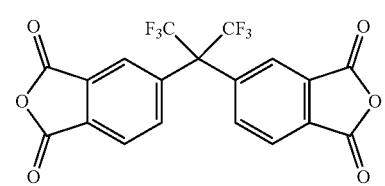

[Formula 1-2]

[Formula 1-3]
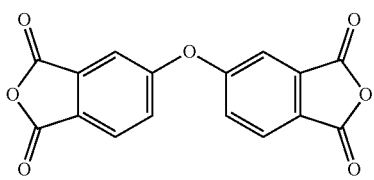

[Formula 1-4]
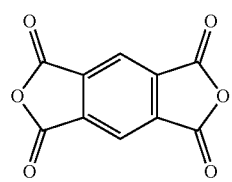

[Formula 1-5]
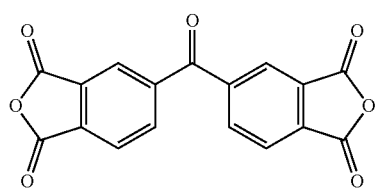

[Formula 1-6]
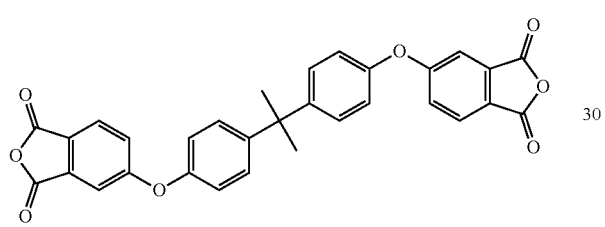

[Formula 2-1]
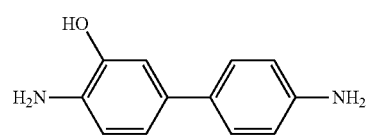

[Formula 2-2]
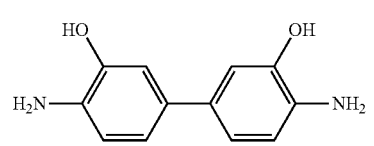

[Formula 2-3]
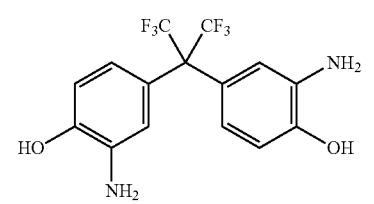

[Formula 2-4]
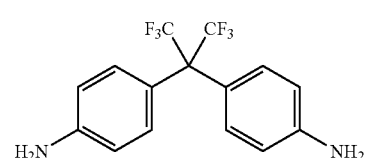

[Formula 2-5]
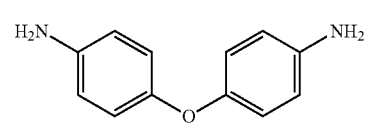

[Formula 2-6]
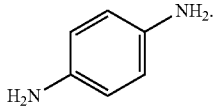

4. The display device as claimed in claim 1, wherein the side chain includes fluorine.

5. The display device as claimed in claim 1, wherein:
the partition wall further includes an addition product of an additive including fluorine, and
the additive includes at least one reactive group from among an acryl group, a methacryl group, an epoxy group, or a maleimide group that may react with the main chain.

6. The display device as claimed in claim 5, wherein the additive is connected in a side chain form to the main chain.

7. The display device as claimed in claim 1, wherein:
the partition wall further includes an addition product of an additive including fluorine, and
the additive is one or more of Formulae 3-1 to 3-6:

[Formula 3-1]
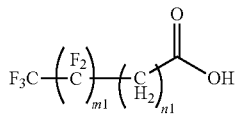

[Formula 3-2]
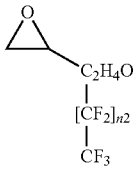

[Formula 3-3]
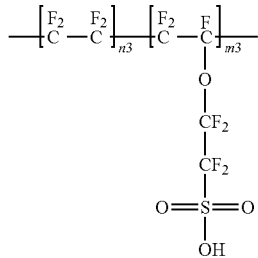

[Formula 3-4]
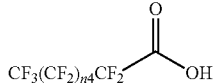

[Formula 3-5]
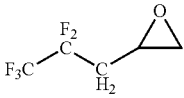

[Formula 3-6]
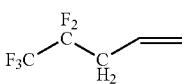

wherein m1 and n1 are independently an integer that is equal to or less than 30, n2 is an integer of 1 to 30, m3 and n3 are independently an integer that is equal to or less than 30, and n4 is an integer of 1 to 30.

8. The display device as claimed in claim 1, wherein the side chain is provided by a compound represented by Formula 4:

[Formula 4]

wherein the X is one of

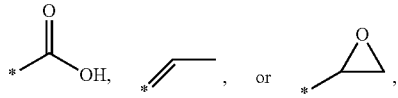

and l is equal to or greater than 13.

9. The display device as claimed in claim 1, wherein the partition wall further includes a reaction product of one or more of an initiator, a crosslinking agent, a photoactive compound, or a surfactant.

10. A display device, comprising:
a substrate;
a thin film transistor provided on the substrate;
a first electrode connected to the thin film transistor;
a second electrode overlapping the first electrode; and
a partition wall and a light-emitting device layer provided between the first electrode and the second electrode, wherein:
the partition wall includes:
a main chain that is a polyimide-based polymer; and
a side chain connected to the main chain,
the side chain is a moiety that includes fluorine, and
a carbon number of the side chain is equal to or greater than 8.

11. The display device as claimed in claim 10, wherein the side chain includes a number of fluorine atoms that is equal to or greater than 8.

12. The display device as claimed in claim 10, wherein the side chain is provided by one or more of Formulae 5-1 to 5-5:

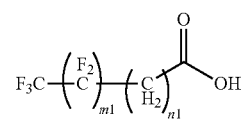
[Formula 5-1]

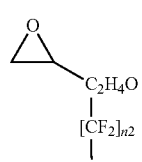
[Formula 5-2]

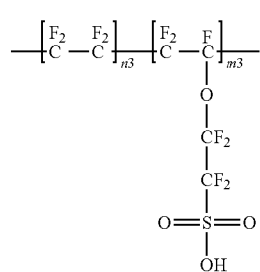
[Formula 5-3]

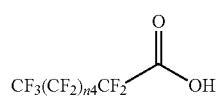
[Formula 5-4]

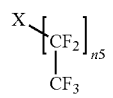
[Formula 5-5]

wherein,
m1 and n1 are independently an integer that is equal to or less than 30,
n2 is an integer of 5 to 30,
m3 and n3 are independently an integer that is equal to or less than 30, provided that a sum of the m3 and n3 is equal to or greater than 2,
n4 is an integer of 6 to 30,
n5 is equal to or greater than 7, and
X is one of

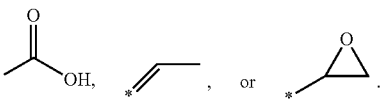

13. The display device as claimed in claim 10, wherein the main chain is a reaction product of a dianhydride compound and a diamine compound.

14. The display device as claimed in claim 10, wherein the main chain is a reaction product of at least one compound from among Formulae 1-1 to 1-6 and at least one compound from among Formulae 2-1 to 2-6:

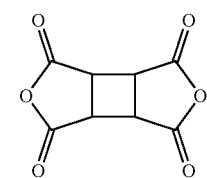
[Formula 1-1]

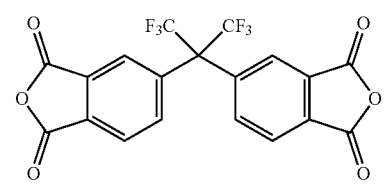
[Formula 1-2]

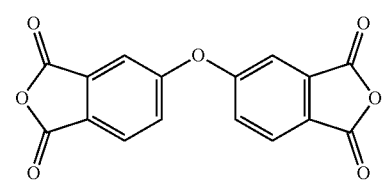
[Formula 1-3]

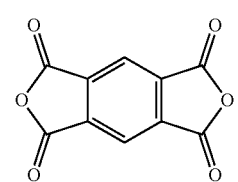
[Formula 1-4]

-continued

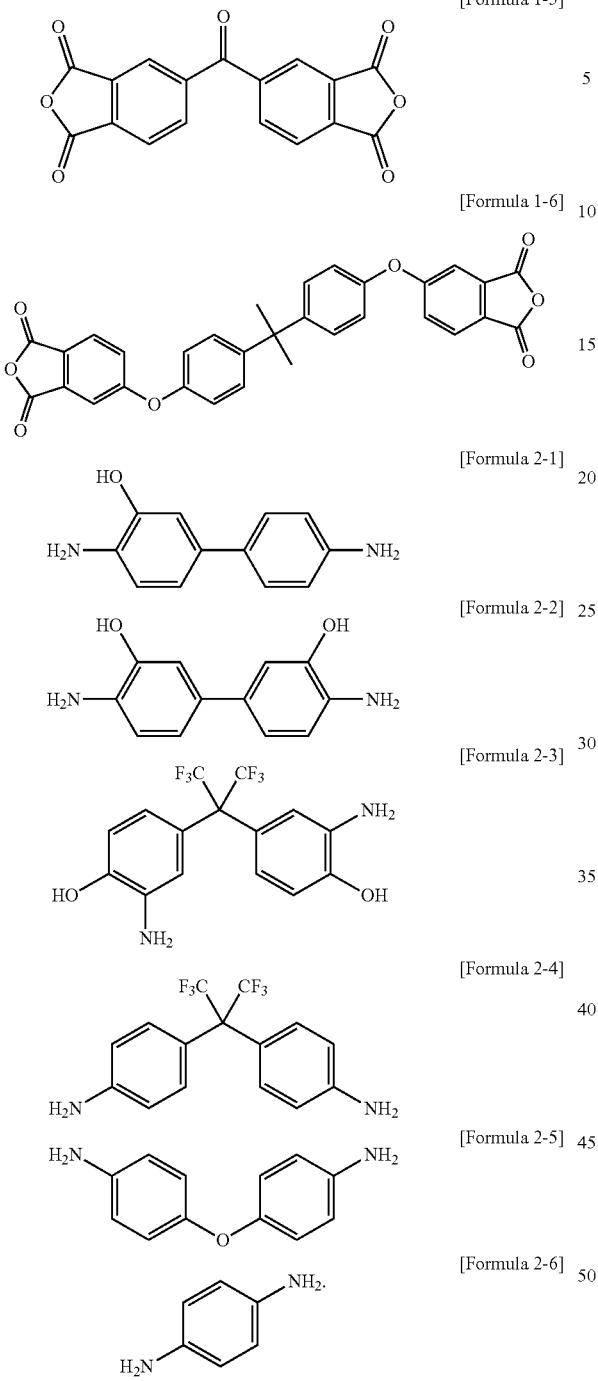

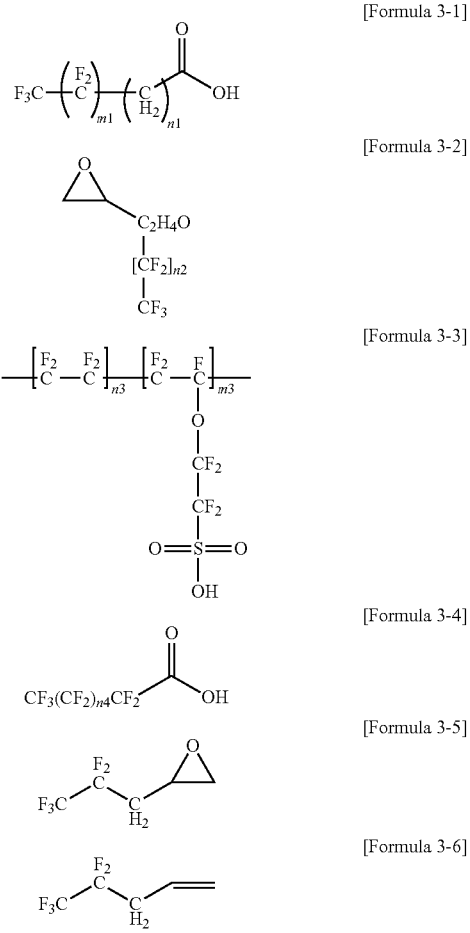

15. The display device as claimed in claim 10, wherein:
the partition wall further includes an addition product of an additive including fluorine, and
the additive includes at least one reactive group from among an acryl group, a methacryl group, an epoxy group, or a maleimide group that may react with the main chain.

16. The display device as claimed in claim 15, wherein the additive is connected in a side chain form to the main chain.

17. The display device as claimed in claim 10, wherein:
the partition wall further includes an addition product of an additive including fluorine, and
the additive is one of Formulae 3-1 to 3-6:

wherein:
m1 and n1 are independently an integer that is equal to or less than 30,
n2 is an integer of 1 to 30,
m3 and n3 are independently an integer that is equal to or less than 30, and
n4 is an integer of 1 to 30.

18. The display device as claimed in claim 10, wherein the partition wall further includes a reaction product of one or more of an initiator, a crosslinking agent, a photoactive compound, or a surfactant.

19. The display device of claim 1, wherein
the light-emitting device layer further includes an emission layer, and the emission layer includes a quantum dot material.

20. The display device of claim 10, wherein
the light-emitting device layer further includes an emission layer, and the emission layer includes a quantum dot material.

* * * * *